US009619604B1

(12) United States Patent
Rai et al.

(10) Patent No.: US 9,619,604 B1
(45) Date of Patent: Apr. 11, 2017

(54) ELECTRICAL ANALYSIS PROCESS

(71) Applicant: Cadence Design Systems, Inc., San Jose, CA (US)

(72) Inventors: Nityanand Rai, Delhi (IN); Xin Gu, Austin, TX (US); Hui Zheng, Round Rock, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/885,249

(22) Filed: Oct. 16, 2015

(51) Int. Cl.
 *G06F 17/50* (2006.01)

(52) U.S. Cl.
 CPC .............................. *G06F 17/5068* (2013.01)

(58) Field of Classification Search
 CPC ... H04L 12/40136; G06F 21/79; G06F 21/86; G06F 2221/2129; G06F 17/5036; G06F 12/0866; G06F 1/1626; G06F 2212/2022; G06F 17/5018; G06F 17/5045; G06F 1/3218; G06F 1/3265; G06F 2217/40
 USPC ................................. 716/132–136, 100–106
 See application file for complete search history.

(56) References Cited

U.S. PATENT DOCUMENTS

2010/0251198 A1\* 9/2010 Widiger .............. G06F 17/5036
  716/139
2014/0123086 A1\* 5/2014 Buck .................. G06F 17/5081
  716/102

\* cited by examiner

*Primary Examiner* — Binh Tat
(74) *Attorney, Agent, or Firm* — Mark H. Whittenberger, Esq.; Holland & Knight LLP (57) ABSTRACT

The present disclosure relates to a system and method for determining an effective electrical resistance in an electronic circuit design. Embodiments may include receiving, at one or more computing devices, an electronic circuit design and identifying one or more features associated with the electronic circuit design. Embodiments may also include performing a resistance only extraction of a circuit net associated with the electronic circuit design and identifying at least two node locations from the electronic circuit as one or more port nodes. Embodiments may further include reducing the resistance only extraction to an equivalent circuit including only the port nodes and attaching a high-resistance ground voltage source to at least one of the port nodes of the reduced equivalent circuit. Embodiments may also include generating a conductance matrix, based upon, at least in part, the reduced equivalent circuit.

20 Claims, 5 Drawing Sheets

502 — gathering the design inputs and ESD and power pin locations

504 — performing the Resistance ("R") only extraction of the circuit net to be analyzed 506 — marking the ESD and bump node locations as port nodes 508 — reducing the 'R' circuit to an equivalent 'R' circuit containing only port nodes 510 — attaching a ground voltage source having a very high resistance to any of the nodes of the reduced circuit 512 — generating the conductance matrix and the Cholesky factorization of the above matrix ("L1")

514 — for all of the nodes in the circuit, the process may pre-compute the forward solve with unit vector as $S_i = L1^{-1} E_i$ 516 — In order to compute the resistance between any 'i' and 'j' node in the above system using: $R(i,j) = |S_i|^2 - |(S_i)^t \cdot (S_j)|^2 / |S_j|^2$

FIG. 5

ELECTRICAL ANALYSIS PROCESS

FIELD OF THE INVENTION

The present disclosure relates to electronic design automation (EDA), and more specifically, to a method for analyzing a model of an electrical circuit.

DISCUSSION OF THE RELATED ART

EDA utilizes software tools that may be used in the design and analysis of numerous electronic systems such as printed circuit boards (PCBs) and integrated circuits (ICs). Some EDA tools are configured to handle the issue of electro static discharge ("ESD"). ESD generally relates to the transfer of charge between bodies at different electrical potentials. However, electrostatic discharge may alter the electrical characteristics of a semiconductor device, which may degrade or destroy the device. As ESD is a high surge current event it has become a major reliability problem in the semiconductor industry.

In order to protect the functional modules in integrated circuits from ESD events, protection cells are often utilized, generally between the functional modules and the input/output ("I/O") terminals (e.g., bumps, pins, pads, etc.) of the integrated circuit. For example, for ESD protection, it is often required that for each bump in the electrical circuit there exists an ESD cell through which its static charge can be discharged without damaging the devices. To ensure that static charge on a bump is discharged only through the ESD devices, it is necessary to ensure that the effective electrical resistance of the bump is below an identified threshold so that the static charge does not go through any other device. In order to ensure this, a large number of effective electrical resistances need to be calculated from multiple sources (e.g., order of 1000's) to multiple destinations (e.g., order of 1000's).

SUMMARY OF INVENTION

In one or more embodiments of the present disclosure, a computer-implemented method for determining an effective electrical resistance in an electronic circuit design is provided. The method may include receiving, at one or more computing devices, an electronic circuit design and identifying one or more features associated with the electronic circuit design. The method may also include performing a resistance only extraction of a circuit net associated with the electronic circuit design and identifying at least two node locations from the electronic circuit as one or more port nodes. The method may further include reducing the resistance only extraction to an equivalent circuit including only the port nodes and attaching a high-resistance ground voltage source to at least one of the port nodes of the reduced equivalent circuit. The method may also include generating a conductance matrix, based upon, at least in part, the reduced equivalent circuit.

One or more of the following features may be included. In some embodiments, the method may include determining a Cholesky factorization associated with the conductance matrix. The method may further include pre-computing a forward solve for all port nodes associated with the electronic circuit design, based upon, at least in part, the Cholesky factorization. In some embodiments, identifying at least two node locations may include identifying at least one ESD node location. Identifying at least two node locations may include identifying at least one bump node location. The method may further include determining a resistance between a first node ("i") and second node ('j') associated with the electronic circuit design. In some embodiments, the one or more features may include at least one of design inputs, electrostatic discharge ("ESD") devices, and power pin locations.

In some embodiments, a computer-readable storage medium for determining an effective electrical resistance in an electronic circuit design is provided. The computer-readable storage medium may have stored thereon instructions that when executed by a machine result in one or more operations. Operations may include may include receiving, at one or more computing devices, an electronic circuit design and identifying one or more features associated with the electronic circuit design. The method may also include performing a resistance only extraction of a circuit net associated with the electronic circuit design and identifying at least two node locations from the electronic circuit as one or more port nodes. Operations may further include reducing the resistance only extraction to an equivalent circuit including only the port nodes and attaching a high-resistance ground voltage source to at least one of the port nodes of the reduced equivalent circuit. Operations may also include generating a conductance matrix, based upon, at least in part, the reduced equivalent circuit.

One or more of the following features may be included. In some embodiments, operations may include determining a Cholesky factorization associated with the conductance matrix. Operations may further include pre-computing a forward solve for all port nodes associated with the electronic circuit design, based upon, at least in part, the Cholesky factorization. In some embodiments, identifying at least two node locations may include identifying at least one ESD node location. Identifying at least two node locations may include identifying at least one bump node location. Operations may further include determining a resistance between a first node ("i") and second node ('j') associated with the electronic circuit design. In some embodiments, the one or more features may include at least one of design inputs, electrostatic discharge ("ESD") devices, and power pin locations.

In one or more embodiments of the present disclosure, a system may include a computing device having at least one processor configured to determine an effective electrical resistance in an electronic circuit design. The system may include a computing device having at least one processor configured to receive an electronic circuit design and identify one or more features associated with the electronic circuit design. The at least one processor may be further configured to perform a resistance only extraction of a circuit net associated with the electronic circuit design and to identify at least two node locations from the electronic circuit as one or more port nodes. The at least one processor may be further configured to reduce the resistance only extraction to an equivalent circuit including only the port nodes. The at least one processor may be further configured to attach a high-resistance ground voltage source to at least one of the port nodes of the reduced equivalent circuit and to generate a conductance matrix, based upon, at least in part, the reduced equivalent circuit.

One or more of the following features may be included. In some embodiments, the at least one processor may be further configured to determine a Cholesky factorization associated with the conductance matrix. The at least one processor may be further configured to pre-compute a forward solve for all port nodes associated with the electronic circuit design, based upon, at least in part, the Cholesky factorization. Identifying at least two node locations may include identifying at least one ESD node location. Identifying at least two node locations may include identifying at least one bump node location. The at least one processor may be further configured to determine a resistance between a first node ("i") and second node (T) associated with the electronic circuit design.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Embodiments of electrical analysis ("EA") process 10 shown in FIGS. 1-5 may provide an efficient approach for computing the electrical equivalent impedance between all pairs of source and destination points for a given electrical circuit network. In other words, embodiments disclosed herein may be configured to compute the resistance from multiple sources to multiple destinations (N*M), 'N' times faster than existing techniques. Traditional approaches for solving this problem required placing a unit voltage source at the source and placing a unit current source at the destination, and measuring the IR drop. Accordingly, a formulated conductance matrix needed to be factorized for each voltage source location and then solved for a number of destination points. Hence, the complexity is N*Factorization_cost+N*M*Solve_cost, for N source and M destinations. Embodiments of EA process 10, which are discussed in further detail hereinbelow, may solve this problem in 1 Factorization_cost+M*Solve_cost, effectively resulting in an N times faster approach.

Figure 1:
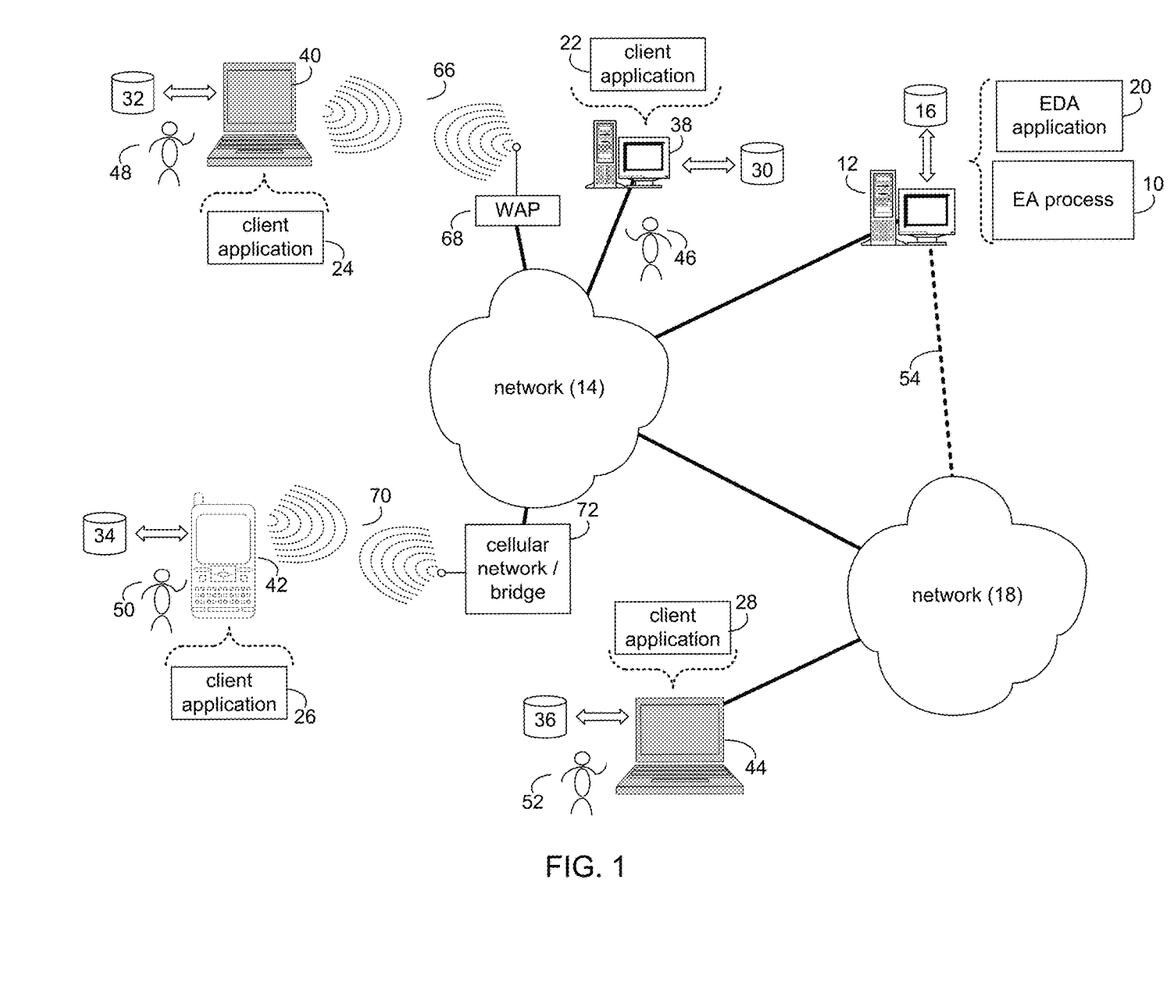
FIG. 1 is a system diagram depicting aspects of the electrical analysis process in accordance with an embodiment of the present disclosure.

Referring to FIG. 1, there is shown electrical analysis process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the electrical analysis process may reside on and be executed, in whole or in part, by a client electronic device, such as a personal computer, notebook computer, personal digital assistant, or the like.

The instruction sets and subroutines of electrical analysis process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Electrical analysis process 10 may be a stand-alone application, or may be an applet/application/script that may interact with and/or be executed within EDA application 20. In addition/as an alternative to being a server-side process, the electrical analysis process may be a client-side process (not shown) that may reside on a client electronic device (described below) and may interact with an EDA client application (e.g., one or more of EDA client applications 22, 24, 26, 28). Further, the electrical analysis process may be a hybrid server-side/client-side process that may interact with EDA application 20 and an EDA client application (e.g., one or more of client applications 22, 24, 26, 28). As such, the electrical analysis process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize electrical analysis process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CEO, Red Hat Linux, or other suitable operating system. (Windows CE is a registered trademark of Microsoft Corporation in the United States, other countries, or both.).

Figure 2:
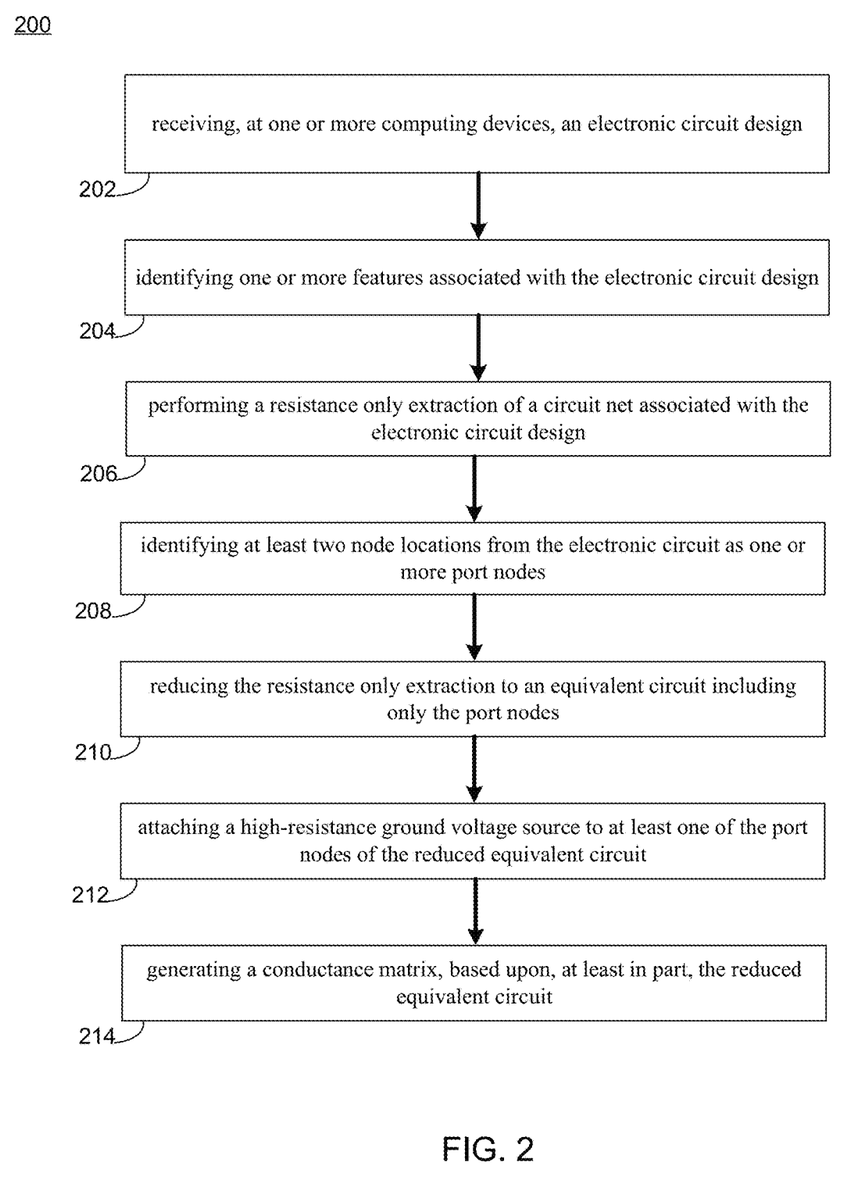
FIG. 2 is a flowchart depicting operations consistent with the electrical analysis process of the present disclosure.

Referring to FIGS. 2-6, various embodiments consistent with electrical analysis process 10 are provided. As shown in FIG. 2, embodiments of electrical analysis process 10 may be configured to determine an effective electrical resistance in an electronic circuit design. Embodiments of process 10 may include receiving (202), at one or more computing devices, an electronic circuit design and identifying (204) one or more features associated with the electronic circuit design. EA process 10 may further include performing (206) a resistance only extraction of a circuit net associated with the electronic circuit design and identifying (208) at least two node locations from the electronic circuit as one or more port nodes. Embodiments may also include reducing (210) the resistance only extraction to an equivalent circuit including only the port nodes and attaching (212) a high-resistance ground voltage source to at least one of the port nodes of the reduced equivalent circuit and generating (214) a conductance matrix, based upon, at least in part, the reduced equivalent circuit. These operations, and others, are discussed in further detail hereinbelow.

The phrase "port node" as used herein, may refer to one or more nodes of an electronic circuit that may be identified and/or marked to be preserved in a reduced circuit operation prior to determining an effective resistance among those nodes. Once the electronic circuit has been reduced to its port nodes and a high impedance grounded source is attached to any of these reduced nodes, the resultant circuit conductance matrix 'G' may be generated as is discussed in further detail hereinbelow.

As discussed above, for ESD protection, it may be necessary that each bump in the circuit has an ESD cell associated therewith through which its static charge may be discharged. This may prevent any unwanted damage to the devices. Accordingly, in order to ensure that the static charge on a bump is discharged only through the ESD devices, EA process 10 may determine whether the effective electrical resistance is under a certain threshold so that the static charge does not pass through any other device. In this way, EA process 10 may be configured to determine a large number of effective resistances that are calculated from multiple sources to multiple destinations.

Figure 3:
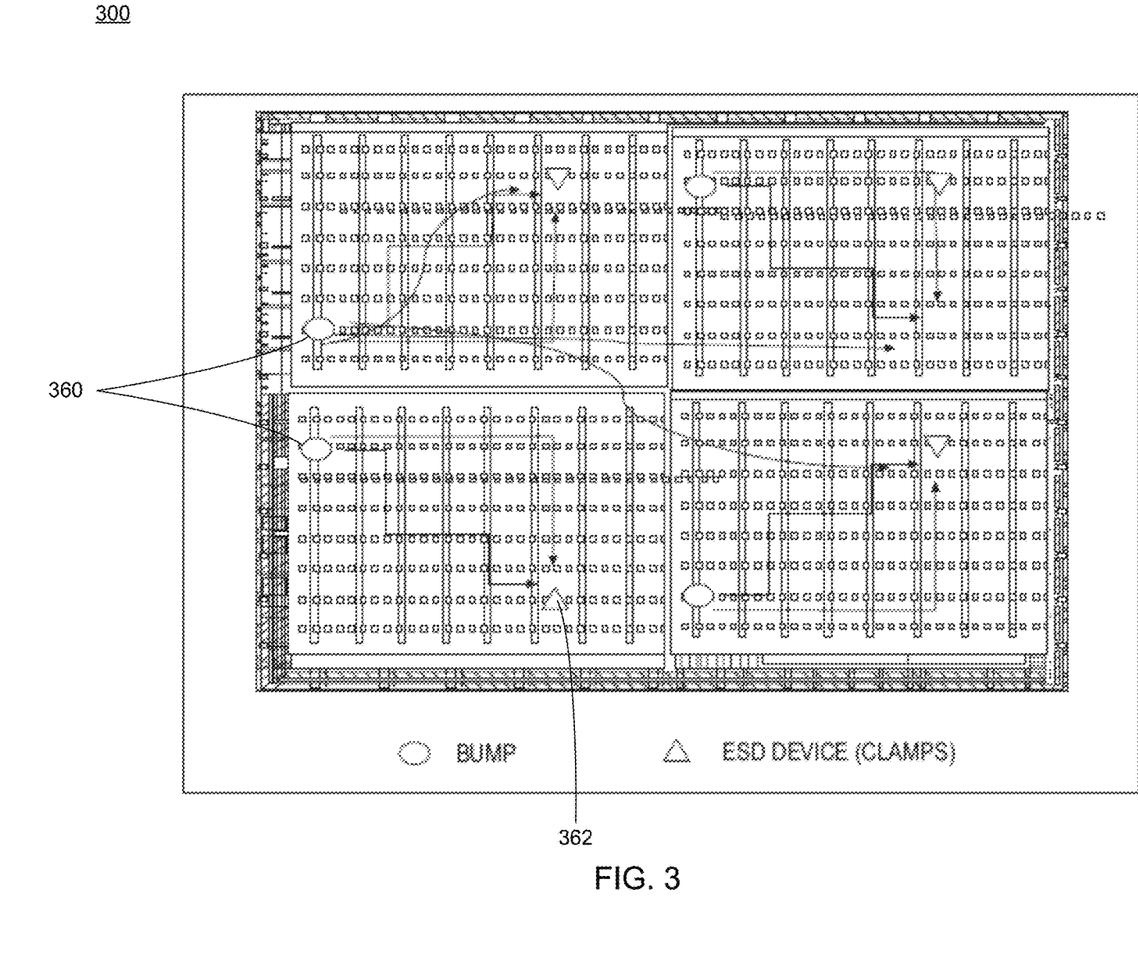
FIG. 3 is a schematic depicting aspects of the electrical analysis process in accordance with an embodiment of the present disclosure.
Figure 4:
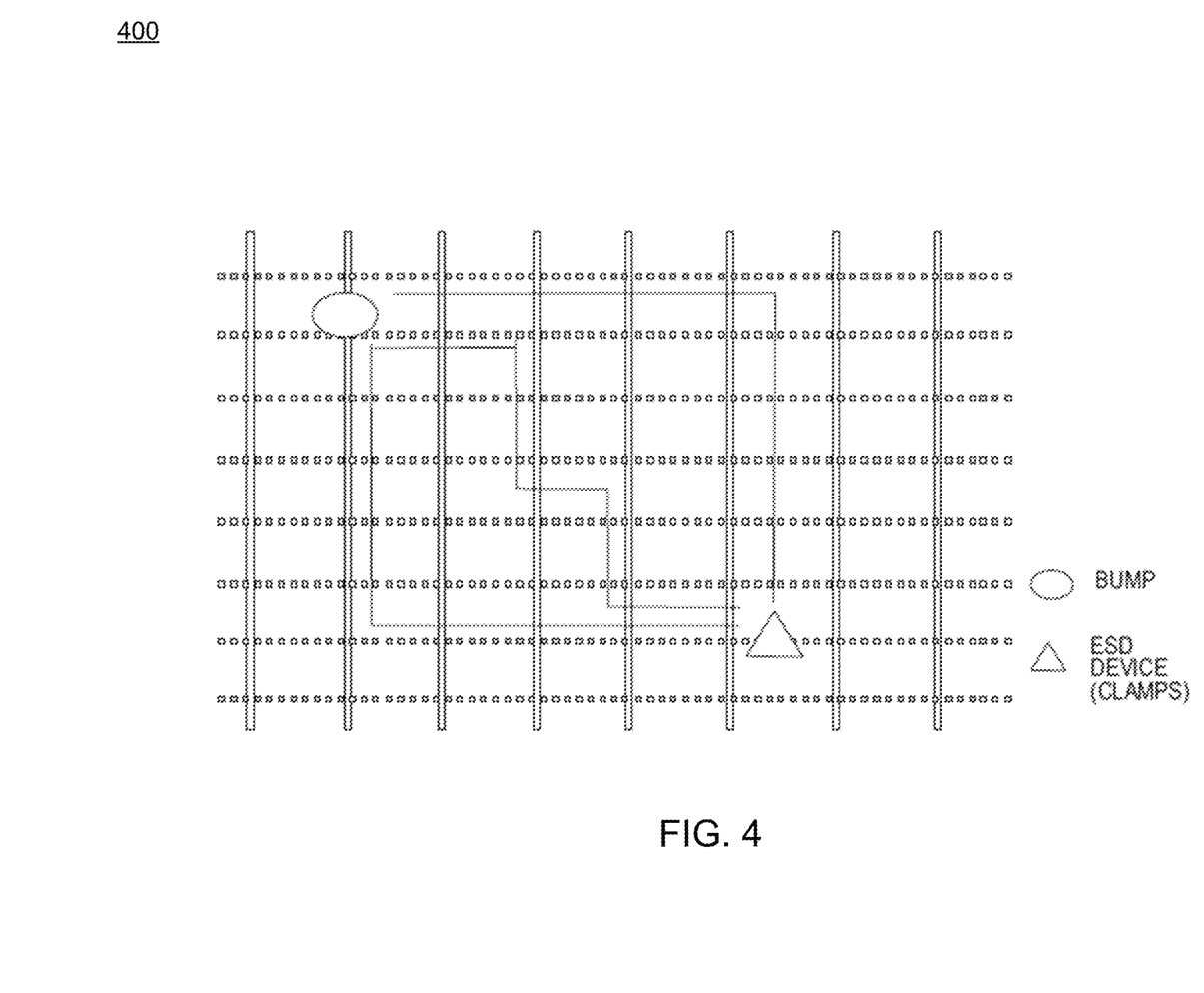
FIG. 4 is a schematic depicting aspects of the electrical analysis process in accordance with an embodiment of the present disclosure.

Referring also to FIG. 3, one embodiment of an electronic design 300 is provided. EA process 10 may be configured to identify one or more bumps and ESD devices associated with a particular electronic design and to determine an effective resistance between every bump 360 and ESD device pair 362. More specifically, for any number of bumps that are identified by EA process 10, embodiments disclosed herein may be configured to ensure that there is an ESD device with an effective resistance less than a predetermined specified limit.

In a large circuit, any effective resistance calculation among large numbers (e.g. pairs) of nodes is an extremely difficult engineering problem requiring an extremely complex and computationally extensive solution. An example of a graph-based search algorithm is provided in FIG. 4, however, existing graph-based approaches only identify least resistance paths, not the effective resistance. Because of the presence of multiple alternate paths between bumps and ESD cells, the resistance of the least resistive path will be considerably higher than effective resistance.

Given an 'R' network of billions of nodes, embodiments of EA process 10 may be configured to find the equivalent resistance between a given set of independent pair of points. Embodiments may include reducing the circuit to include only source and destination nodes (e.g., schur form). Grounding the source node and placing a current source of 1 unit on the destination nodes. To ground the node, embodiments may include removing that node from G and formulating an (N−1)×(N−1) matrix, many changes in G. Other embodiments may include adding a very high conductance to the diagonal value of grounded node. These two approaches may lead to a change in G with change in voltage source and hence re-factorization. Accordingly, embodiments may further include forming a G Matrix, factorizing and generating a solution. Embodiments may further include changing the location of voltage source to next point, constructing G, performing Cholesky factorization and computing:

$$\text{Reff} = rhs^t \cdot G^{-1} \cdot rhs$$

In some embodiments, EA process 10 may be configured to enable grounding for each source location of a node. Accordingly, EA process 10 may re-factorize a G matrix in order to compute the Cholesky factor "L". To overcome this problem EA process 10 may generate and/or formulate the equation above using a modified nodal analysis ("MNA"):

$$\begin{bmatrix} & & 1 \\ & & -1 \\ 1 & -1 & 0 \end{bmatrix} \begin{bmatrix} e_k \\ e_l \\ i_{kl} \end{bmatrix} = \begin{bmatrix} \\ \\ E_{kl} \end{bmatrix}$$

Embodiments of EA process 10 may include generating and/or formulating the MNA matrix of G*v=rhs as:

$$\begin{pmatrix} G11 & G12 & G13 & 1 \\ G21 & G22 & G23 & 0 \\ G31 & G32 & G33 & 0 \\ 1 & 0 & 0 & 0 \end{pmatrix} \times \begin{pmatrix} v1 \\ v2 \\ v3 \\ ignd \end{pmatrix} = \begin{pmatrix} i1 \\ i2 \\ i3 \\ 0 \end{pmatrix}$$

Embodiments of EA process 10 may include representing this matrix as $$G = \begin{pmatrix} G' & B^t \\ B & C \end{pmatrix}$$

Where $$G' = \begin{pmatrix} G11 & G12 & G13 \\ G21 & G22 & G23 \\ G31 & G32 & G33 \end{pmatrix} \text{ and } B^t = \begin{pmatrix} 1 \\ 0 \\ 0 \end{pmatrix} \text{ and } C = (0)$$

The Cholesky Factorization of G matrix may be given by:

$$L = \begin{pmatrix} L1 & 0 \\ (L1^{-1}B)^t & Chol(C - (L1^{-1}B) \cdot (L1^{-1}B)^t) \end{pmatrix}$$

Here, L1 is the Cholesky factorization of G'. Simplifying it further with given B and C leads to L as:

$$\begin{pmatrix} L1 & 0 \\ (L1^{-1}B)^t & chol(-|L1^{-1}B|^2) \end{pmatrix} = \begin{pmatrix} L1 & 0 \\ (L1^{-1}B)^t & sqrt(-|L1^{-1}B|^2) \end{pmatrix}$$

In the example above, "L1" is the Cholesky factorization of the full conductance matrix of the original circuit. Since this circuit is singular, for calculating L1 embodiments of EA process 10 may attach a high resistance grounded source, this matrix perturbation does not impact the solution in our problem domain.

Now we know $$\text{Reff} = rhs^t \cdot G' \cdot rhs \Rightarrow rhs^t \cdot (L \cdot L^t)^{-1} \cdot rhs \Rightarrow rhs^t \cdot L^{-t} L^{-1} rhs$$
$$\Rightarrow (L^{-1} \cdot rhs)^t \cdot (L^{-1} \cdot rhs) \therefore \text{Reff} = |L^{-1} \cdot rhs|^2$$

Now, solving if the L has a form above leads to:

$$L^{-1} \cdot rhs = \left[ (L1^{-1} \cdot rhs) \frac{(L1^{-1} \cdot B)^t \cdot (L1^{-1} \cdot rhs)}{\sqrt{-(L1^{-1} \cdot B) \cdot (L1^{-1} \cdot B)^t}} \right]$$

$$\because \text{Reff} = |L1^{-1} \cdot rhs|^2$$

$$\therefore \text{Reff} = |L1^{-1} \cdot rhs|^2 - \frac{|(L1^{-1} \cdot B)^t \cdot (L1^{-1} \cdot rhs)|^2}{|L1^{-1} \cdot B|^2}$$

In the example above, L1 may be a singular matrix, which may be made non-singular by attaching a high resistance ground source to least value diagonal. In some embodiments, "rhs" may be a unit vector with unit value at the desired destination node, similarly "B" may also be a unit vector with unit at desired source node.

Figure 5:
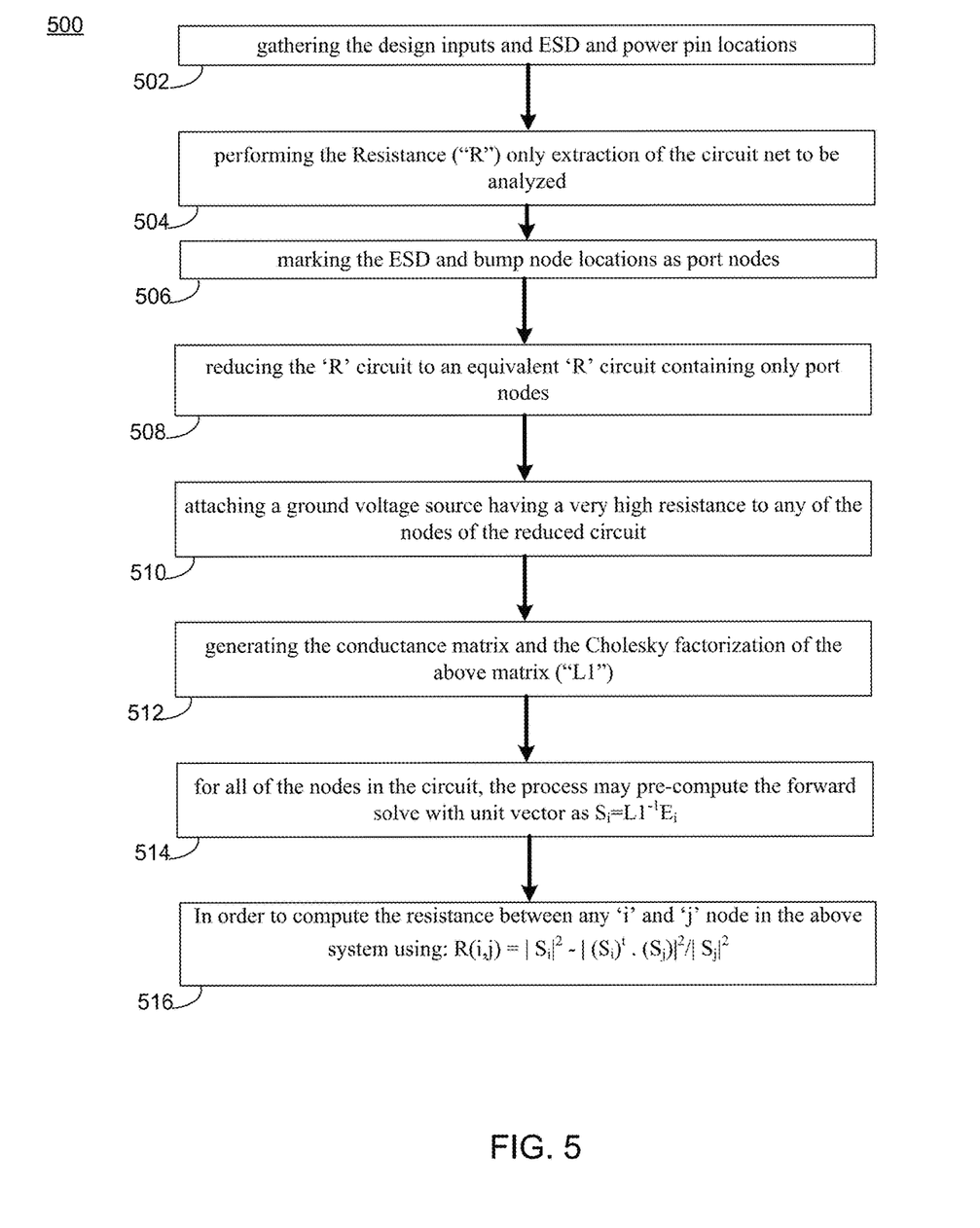
FIG. 5 is a flowchart depicting aspects of the electrical analysis process in accordance with an embodiment of the present disclosure.

Referring now to FIG. 5, a flowchart 500 consistent with an embodiment of EA process 10 is provided. In this particular embodiment, the process may include gathering (502) the design inputs and ESD and power pin locations. The process may further include performing (504) the Resistance ("R") only extraction of the circuit net to be analyzed. The process may also include identifying and/or marking (506) the ESD and bump node locations as port nodes. The process may further include reducing (508) the 'R' circuit to an equivalent 'R' circuit containing only port nodes. The process may also include attaching (510) a ground voltage source having a very high resistance of the order of >10⁴ times of maximum value of resistor in the circuit under analysis to any of the nodes of the reduced circuit. The process may include generating (512) the conductance matrix and computing the Cholesky factorization of the above matrix ("L1") as set forth above. For all of the nodes in the circuit, the process may pre-compute (514) the forward solve with unit vector $E_i$ as $S_i = L1^{-1} E_i$. In order to compute the resistance between any 'i' and 'j' node in the above system the following equation may be utilized:

$$R(i, j) = |S_i|^2 - \frac{|S_i \cdot S_j|^2}{|S_j|^2}$$

Since B and rhs are both unit vectors, they can have a maximum of 'N' distinct values, hence maximum N solve are required for all pair computation. So traditional approach for N sources and M destination would take up N*factorization+N*M*solve. In contrast, embodiments of EA process 10 may be N times faster, will take just 1*factorization+M*solve.

Embodiments of EA process 10 provide significant results over existing technologies:

| Instance Pairs | Latest | Reference |
| --- | --- | --- |
| 500 Pairs | 0.3 seconds | 362 seconds |
| 1000 Pairs | 0.7 seconds | 6052 seconds |
| 2000 Pairs | 4.4 seconds | 164805 seconds |

Accordingly, embodiments of EA process 10 may receive a linear circuit having a network of a billion nodes and compute the effective resistance between multiple sources (order of 1000's) and multiple destinations (order if 1000's) in only a few seconds. Additionally and/or alternatively, EA process 10 may also provide a constant run-time whether the computation is between 1×N or between N*N source/destinations pairs. It should be noted that embodiments of EA process 10 may be particularly beneficial for calculating the effective resistance if the number of sources and number of destinations are of the same order.

Embodiments of EA process 10 may applied in a number of suitable environments. For example, EA process 10 may be used to generate a fast circuit simulator (e.g., a fast spice engine) where multiple simulation results of a circuit with changing locations of voltage source and current sink may be performed in a single simulation. Additionally and/or alternatively, for non linear circuits, if the frequency is constant, embodiments disclosed herein may be used to measure impedance between multiple points in a single simulation.

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C' or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for determining an effective electrical resistance in an electronic circuit design comprising:
   receiving, at one or more computing devices, an electronic circuit design;
   identifying one or more features associated with the electronic circuit design;
   performing a resistance only extraction of a circuit net associated with the electronic circuit design;
   identifying at least two node locations from the electronic circuit as one or more port nodes;
   reducing the resistance only extraction to an equivalent circuit including only the port nodes;
   attaching a high-resistance ground voltage source to at least one of the port nodes of the reduced equivalent circuit; and
   generating a conductance matrix, based upon, at least in part, the reduced equivalent circuit.

2. The computer-implemented method of claim 1, further comprising:
   determining a Cholesky factorization associated with the conductance matrix.

3. The computer-implemented method of claim 2, further comprising:
   pre-computing a forward solve for all port nodes associated with the electronic circuit design, based upon, at least in part, the Cholesky factorization.

4. The computer-implemented method of claim 1, wherein identifying at least two node locations includes identifying at least one ESD node location.

5. The computer-implemented method of claim 1, wherein identifying at least two node locations includes identifying at least one bump node location.

6. The computer-implemented method of claim 3, further comprising:
   determining a resistance between a first node ("i") and second node ('j') associated with the electronic circuit design.

7. The computer-implemented method of claim 1, wherein the one or more features include at least one of design inputs, electrostatic discharge ("ESD") devices, and power pin locations.

8. A non-transitory computer-readable storage medium having stored thereon instructions that when executed by a machine result in the following operations:
   receiving, at one or more computing devices, an electronic circuit design;
   identifying one or more features associated with the electronic circuit design;
   performing a resistance only extraction of a circuit net associated with the electronic circuit design;
   identifying at least two node locations from the electronic circuit as one or more port nodes;
   reducing the resistance only extraction to an equivalent circuit including only the port nodes;
   attaching a high-resistance ground voltage source to at least one of the port nodes of the reduced equivalent circuit; and
   generating a conductance matrix, based upon, at least in part, the reduced equivalent circuit.

9. The computer-readable storage medium of claim 8, wherein operations further comprise:
   determining a Cholesky factorization associated with the conductance matrix.

10. The computer-readable storage medium of claim 9, wherein operations further comprise: pre-computing a forward solve for all port nodes associated with the electronic circuit design, based upon, at least in part, the Cholesky factorization.

11. The computer-readable storage medium of claim 8, wherein identifying at least two node locations includes identifying at least one ESD node location.

12. The computer-readable storage medium of claim 8, wherein identifying at least two node locations includes identifying at least one bump node location.

13. The computer-readable storage medium of claim 10, wherein operations further comprise: determining a resistance between a first node ("i") and second node ('j') associated with the electronic circuit design.

14. The computer-readable storage medium of claim 11, wherein the one or more features include at least one of design inputs, electrostatic discharge ("ESD") devices, and power pin locations.

15. A system for determining an effective electrical resistance in an electronic circuit design comprising:
   a computing device having at least one processor configured to receive an electronic circuit design and identify one or more features associated with the electronic circuit design, the at least one processor further configured to perform a resistance only extraction of a circuit net associated with the electronic circuit design and to identify at least two node locations from the electronic circuit as one or more port nodes, the at least one processor further configured to reduce the resistance only extraction to an equivalent circuit including only the port nodes, the at least one processor further configured to attach a high-resistance ground voltage source to at least one of the port nodes of the reduced equivalent circuit and to generate a conductance matrix, based upon, at least in part, the reduced equivalent circuit.

16. The system of claim 15, wherein the at least one processor is further configured to determine a Cholesky factorization associated with the conductance matrix.

17. The system of claim 16, wherein the at least one processor is further configured to pre-compute a forward solve for all port nodes associated with the electronic circuit design, based upon, at least in part, the Cholesky factorization.

18. The system of claim 15, wherein identifying at least two node locations includes identifying at least one ESD node location.

19. The system of claim 15, wherein identifying at least two node locations includes identifying at least one bump node location.

20. The system of claim 17, wherein the at least one processor is further configured to determine a resistance between a first node ("i") and second node ('j') associated with the electronic circuit design.

* * * * *